United States Patent
Acharyya et al.

(10) Patent No.: US 7,698,079 B2
(45) Date of Patent: Apr. 13, 2010

(54) CHARACTERIZING ACROSS-DIE PROCESS VARIATION

(75) Inventors: Dhruva J. Acharyya, Austin, TX (US); Kanak B. Agarwal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 11/946,571

(22) Filed: Nov. 28, 2007

(65) Prior Publication Data
US 2009/0138227 A1   May 28, 2009

(51) Int. Cl.
*G01R 19/00* (2006.01)
(52) U.S. Cl. .............................. 702/64; 324/765; 716/5
(58) Field of Classification Search ................... 702/64, 702/118; 324/713, 763, 765; 716/5
See application file for complete search history.

(56) References Cited

U.S. PATENT DOCUMENTS

| | | | |
|---|---|---|---|
| 6,175,244 B1 * | 1/2001 | Gattiker et al. ............... | 324/765 |
| 6,941,235 B2 * | 9/2005 | Gattiker ....................... | 702/64 |
| 7,127,690 B2 * | 10/2006 | Gattiker et al. ................. | 716/5 |

* cited by examiner

*Primary Examiner*—John H Le
(74) *Attorney, Agent, or Firm*—Dillon & Yudell LLP

(57) ABSTRACT

Measurement of individual quiescent supply currents from multiple power supply pads located across a semiconductor die provides a means of characterizing across-die variation. A ratio is created by combining the individual pad supply current with the sum of all pad supply currents for a given die. An n-tuple is formed from the set of ratios for all pad supply currents to provide a unique signature for different across-die variation profiles.

6 Claims, 2 Drawing Sheets

CHARACTERIZING ACROSS-DIE PROCESS VARIATION

BACKGROUND OF THE INVENTION

The present disclosure relates to the field of computers, and specifically to their use in automating semiconductor process characterization.

As semiconductor processes scale to smaller geometries, the chips or dies produced become more sensitive to process variations. These process variations often result in variability in performance parameters across the final die.

BRIEF SUMMARY OF THE INVENTION

Measurement of individual quiescent supply currents from multiple power supply pads located across a semiconductor die provides a means of characterizing across-die variation. A ratio is created by combining the individual pad supply current with the sum of all pad supply currents for a given die. An n-tuple is formed from the set of ratios for all pad supply currents to provide a unique signature for different across-die variation profiles. An algorithm utilizing these unique profiles provides an autonomous means for simplified die binning beyond the pass/fail decision level.

The above as well as additional objectives, features, and advantages of the present invention will become apparent in the following detailed written description.

BRIEF DESCRIPTION OF THE SEVERAL VIEWS OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF THE INVENTION

Figure 1:
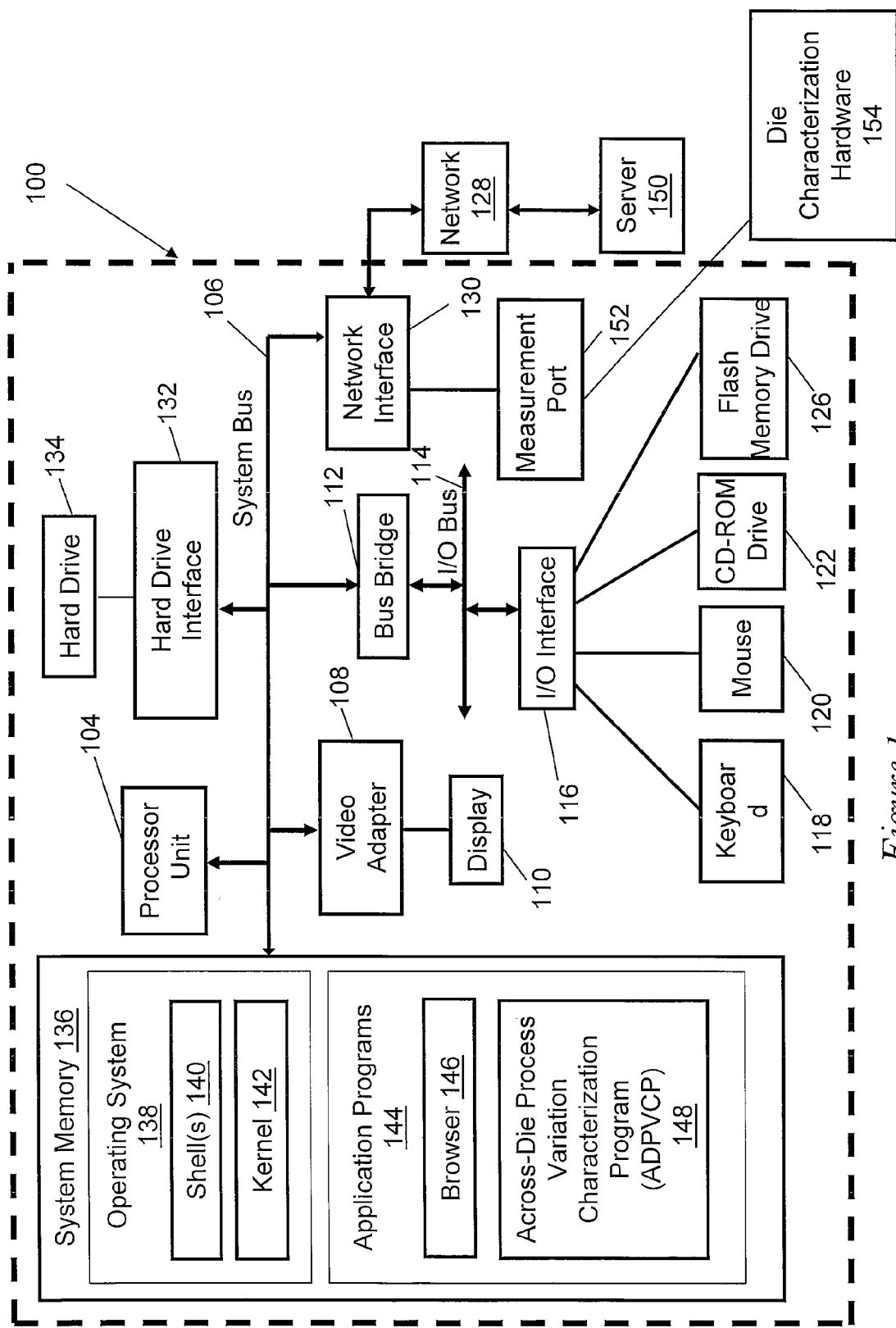
FIG. 1 depicts an exemplary computer in which the present invention may be implemented.

As will be appreciated by one skilled in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium. In a preferred embodiment, the computer program product comprises a semiconductor process variation characterization tool.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

With reference now to FIG. 1, there is depicted a block diagram of an exemplary computer 100, with which the present invention may be utilized. Computer 100 includes a processor unit 104 that is coupled to a system bus 106. A video adapter 108, which drives/supports a display 110, is also coupled to system bus 106. System bus 106 is coupled via a bus bridge 112 to an Input/Output (I/O) bus 114. An I/O interface 116 is coupled to I/O bus 114. I/O interface 116 affords communication with various I/O devices, including a keyboard 118, a mouse 120, a Compact Disk-Read Only Memory (CD-ROM) drive 122, and a flash memory drive 126. The format of the ports connected to I/O interface 116 may be any known to those skilled in the art of computer architecture, including but not limited to Universal Serial Bus (USB) ports.

Computer 100 is able to communicate with a server 150 via a network 128 using a network interface 130, which is coupled to system bus 106. Network 128 may be an external network such as the Internet, or an internal network such as an Ethernet or a Virtual Private Network (VPN). Server 150 may be architecturally configured in the manner depicted for computer 100. Measurement Port 152 provides access to die characterization hardware 154. Die characterization hardware 154 may include, but is not limited to, logic probes, oscilloscopes, and other test logic associated with probing, measuring, and otherwise testing integrated circuits.

A hard drive interface 132 is also coupled to system bus 106. Hard drive interface 132 interfaces with a hard drive 134. In one embodiment, hard drive 134 populates a system memory 136, which is also coupled to system bus 106. System memory 136 is defined as a lowest level of volatile memory in computer 100. This volatile memory may include additional higher levels of volatile memory (not shown), including, but not limited to, cache memory, registers, and buffers. Code that populates system memory 136 includes an operating system (OS) 138 and application programs 144.

OS 138 includes a shell 140, for providing transparent user access to resources such as application programs 144. Generally, shell 140 (as it is called in UNIX®) is a program that provides an interpreter and an interface between the user and the operating system. Shell 140 provides a system prompt, interprets commands entered by keyboard 118, mouse 120, or other user input media, and sends the interpreted command(s) to the appropriate lower levels of the operating system (e.g., kernel 142) for processing. As depicted, OS 138 also includes kernel 142, which includes lower levels of functionality for OS 138. Kernel 142 provides essential services required by other parts of OS 138 and application programs 144. The services provided by kernel 142 include memory management, process and task management, disk management, and I/O device management.

Application programs 144 include a browser 146. Browser 146 includes program modules and instructions enabling a World Wide Web (WWW) client (i.e., computer 100) to send and receive network messages to the Internet. Application programs 144 also include an Across-Die Process Variation Characterization Program (ADPVCP) 148, which is preferably a process characterization tool that includes software code for performing the methods described below in FIG. 2.

Computer 100 may utilize HyperText Transfer Protocol (HTTP) messaging to enable communication with server 150. In one embodiment, computer 100 is able to download ADPVCP 148 from service provider server 150, preferably in an "on demand" basis. In another embodiment, service provider server 150 performs all of the functions associated with the present invention (including execution of ADPVCP 148), thus freeing computer 100 from using its own resources.

The hardware elements depicted in computer 100 are not intended to be exhaustive, but rather represent and/or highlight certain components that may be utilized to practice the present invention. For instance, computer 100 may include alternate memory storage devices such as magnetic cassettes, Digital Versatile Disks (DVDs), Bernoulli cartridges, and the like. These and other variations are intended to be within the spirit and scope of the present invention.

Figure 2:
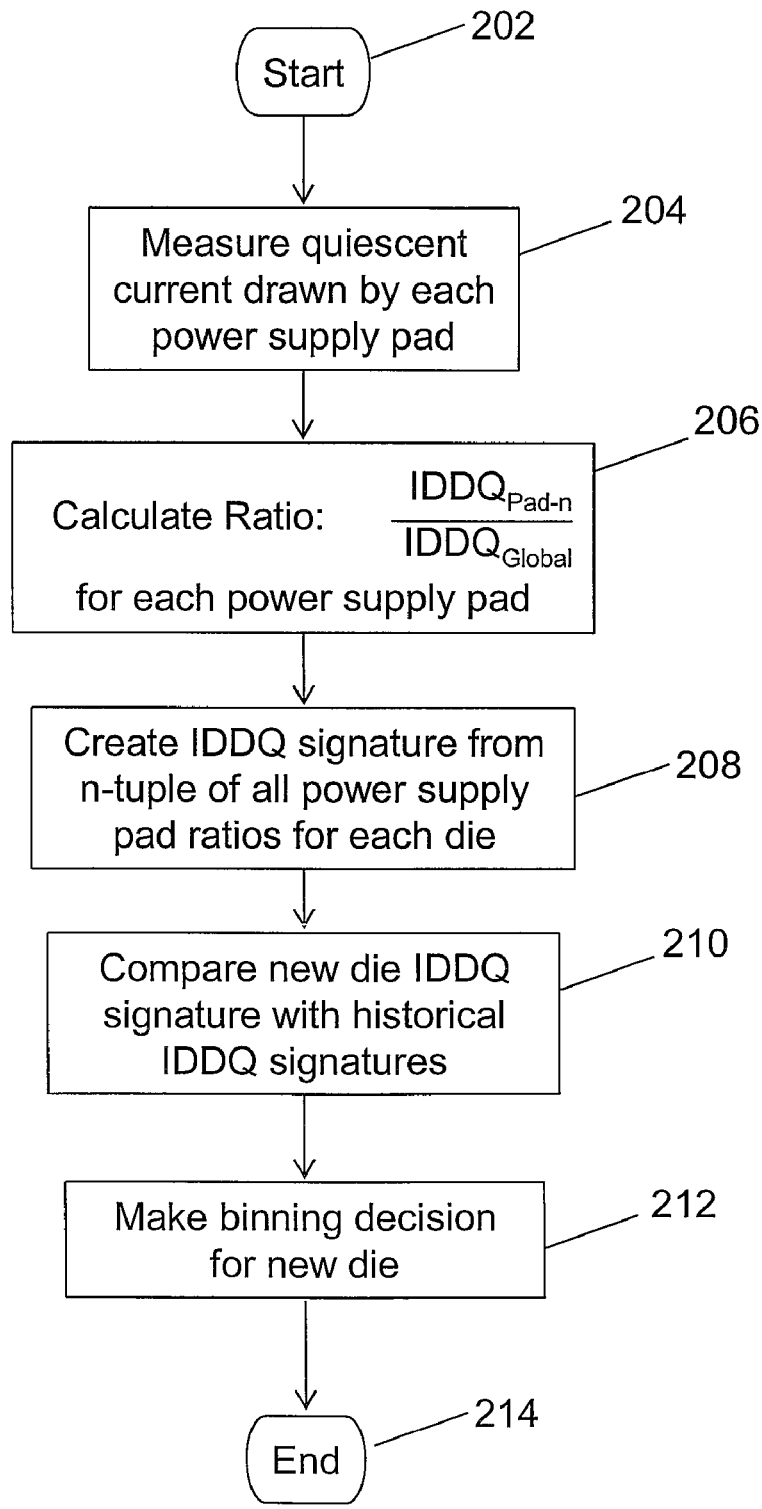
FIG. 2 is a high-level flow-chart of exemplary steps taken to characterize across-die process variation of semiconductor dies.

With reference now to FIG. 2, a high-level flow-chart of steps taken to characterize across-die process variation is presented. After initiator block 202, leakage current measurements are recorded at each power supply pad in an IC die being tested during a quiescent period, during which no computational work is being performed by the IC die being tested (block 204). These currents are measured by applying voltage at all power supply pads. When all supply pads are powered up, a measurement of the quiescent current is taken for every power supply pad on the die and recorded as IDDQPad-n. This notation indicates a supply current, "IDD," of type "quiescent," was recorded from power supply pad "n," where "n" is an integer indicating a particular power supply pad.

After a quiescent supply current (IDDQ) value has been recorded for all of the power supply pads on the die, the individual pad currents are added to form a global IDDQ for the entire die. The global IDDQ is a good indicator of die-to-die process variation but is insufficient in characterizing "within die" variability. The distribution of quiescent supply currents, drawn from individual supply pads located across the chip, is used to extract across-die process variation. In a preferred embodiment, individual ratios are calculated for each power supply pad comprising the ratio IDDQpad/IDDQglobal (block 206). An n-tuple is formed having "n" ratios corresponding to the "n" number of power supply pads found on the die.

After collecting the IDDQ n-tuples for several copies of the same die design, and combining exhaustive performance tests on those same die, a correlation is established between across-die process variation and the sequence of values forming the IDDQ n-tuples. Alternatively, models and circuit simulation can be used to establish a correlation between across-die process variation and IDDQ n-tuple. This correlation provides a unique signature for each of a plurality of spatially correlated process variations (block 208). For example, assume that there are eight power supply pads in a particular IC die. Assume also that measurements at the eight power supply pad indicate: IDDQpad1 for the first power supply pad in the IC die is 5 microamps; IDDQpad2 for the second power supply pad in the IC die is 7 microamps; IDDQpad3 for the third power supply pad in the IC die is 25 microamps; IDDQpad4 for the fourth power supply pad in the IC die is 14 microamps; IDDQpad5 for the fifth power supply pad in the IC die is 18 microamps, IDDQpad6 for the sixth power supply pad in the IC die is 2 microamps; IDDQpad7 for the seventh power supply pad in the IC die is 11 microamps; and IDDQpad8 for the eighth power supply pad in the IC die is 18. Also assume that IDDQglobal for the entire IC die has been measured to be 100 microamps. In this example, the signature for that die would be $\{5/100, 7/100, 25/100, 14/100, 18/100, 2/100, 11/100, 18/100\}$, or $\{0.05, 0.07, 0.25, 0.14, 0.18, 0.02, 0.11, 0.18\}$. This signature thus indicates how much leakage current is drawn at each specific power supply pad in the IC die. This signature is then used to extract spatially correlated across-die process variation profile for this die.

These signatures are stored in a database accessible to the program for the purpose of comparison (block 210) with the present die under test. In a preferred embodiment, a new die under test is sorted automatically by matching the IDDQ signature for the new die with the set of unique signatures stored in the database (block 212). This sort and match step results in the die under test being associated with the bin having that particular unique IDDQ signature. The sequence ends at terminator block 214.

The description of FIG. 2 discusses one power supply voltage and the current associated with it. It is understood that more than one power supply voltage rail may exist on a given die. In that case the program may generate an additional IXXQ n-tuple consisting of all ratios associated with all power supply pads having the VXX voltage rail. The program may then extend the length of the n-tuple to provide a new "n" comprising the sum of the number of VDD pads with the number of VXX pads.

The present invention thus presents a novel method, system and computer-readable medium for use in characterizing process variations between integrated circuit (IC) dies. In one embodiment, the method includes recording electric current measurements at each power supply pad in an integrated circuit (IC) die that is being tested, wherein the electrical current measurements are of a quiescent current (IDDQ) drawn at each power supply pad, and wherein the IDDQ is leakage current that is very sensitive to process variation. Thereafter, recorded electrical current measurements are combined for every power supply pad in the IC die to create a global IDDQ signature for the IC die, wherein the global IDDQ signature is created by forming an n-tuple of individual IDDQ ratios for each power supply pad in the IC die, and wherein each individual IDDQ ratio for each power supply pad is calculated from a ratio IDDQpad/IDDQglobal, wherein IDDQpad is a measured quiescent electric current at a particular power supply pad and IDDQglobal is a measured quiescent electric current for all of the IC die, and wherein each global IDDQ signature indicates how much electric current is drawn at each power supply pad during quiescent activity periods for the IC die. The global IDDQ signature is stored as a stored unique signature, wherein the stored unique signatures describe a plurality of spatially correlated process variations that occurred during manufacturing of the IC die. A current IC unique signature is then compared with stored unique signatures of other IC dies, wherein the current IC unique signature is calculated as another n-tuple by using the ratio IDDQpad/IDDQglobal for every power supply pad in a current IC die being tested. The across-die process variation profile for the current IC die can be extracted, the die can be ranked, and sorted for binning, by comparing the current IC unique signature for the current IC die to stored unique signatures for the other IC dies. It is further noted that quiescent activity periods are periods of time in which no logical operations are being performed by logic in the IC die.

Note that presented above is a scenario in which the IDDQ signature of a current IC is compared with other stored signatures for finding across-die variation. In another embodiment, a correlation model is established, using the same principals described above, between IDDQ n-tuples and across-die variation profiles from circuit models and simulations. The measured IDDQ n-tuple for a die is then mapped to an "across-die" process variation profile by using the pre-developed correlation model in a manner described above.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A computer-implemented method of characterizing process variations between integrated circuit (IC) dies, the method comprising:

a computer recording electric current measurements at each power supply pad in an integrated circuit (IC) die that is being tested, wherein the electrical current measurements are of a quiescent current (IDDQ) drawn at each power supply pad, and wherein the IDDQ is current that is caused by leakage in the IC die;

the computer combining recorded electrical current measurements for every power supply pad in the IC die to create a global IDDQ signature for the IC die, wherein the global IDDQ signature is created by forming an n-tuple of individual IDDQ ratios for each power supply pad in the IC die, and wherein each individual IDDQ ratio for each power supply pad is calculated from a ratio IDDQpad/IDDQglobal, wherein IDDQpad is a measured quiescent electric current at a particular power supply pad and IDDQglobal is a measured quiescent electric current for all of the IC die, and wherein each global IDDQ signature indicates how much electric current is drawn at each power supply pad during quiescent activity periods for the IC die;

the computer storing the global IDDQ signature as a stored unique signature, wherein the stored unique signatures describe a plurality of spatially correlated across-die process variations that occurred during manufacturing of the IC die;

the computer comparing a current IC unique signature with stored unique signatures of other IC dies, wherein the current IC unique signature is calculated as another n-tuple by using the ratio IDDQpad/IDDQglobal for every power supply pad in a current IC die being tested; and the computer ranking, and sorting for binning, the current IC die by comparing the current IC unique signature for the current IC die to stored unique signatures for the other IC dies.

2. The method of claim 1, wherein quiescent activity periods are periods of time in which no logical operations are being performed by logic in the IC die.

3. A system comprising:

a processor;

a data bus coupled to the processor;

a memory coupled to the data bus; and a computer-usable medium embodying computer program code, the computer program code comprising instructions executable by the processor and configured for characterizing across-die process variations in integrated circuit (IC) dies by performing the steps of:

recording electric current measurements at each power supply pad in an integrated circuit (IC) die that is being tested, wherein the electrical current measurements are of a quiescent current (IDDQ) drawn at each power supply pad, and wherein the IDDQ is current that is caused by a leakage in the IC die;

combining recorded electrical current measurements for every power supply pad in the IC die to create a global IDDQ signature for the IC die, wherein the global IDDQ signature is created by forming an n-tuple of individual TDDQ ratios for each power supply pad in the IC die, and wherein each individual IDDQ ratio for each power supply pad is calculated from a ratio IDDQpad/IDDQglobal, wherein IDDQpad is a measured quiescent electric current at a particular power supply pad and IDDQglobal is a measured quiescent electric current for all of the IC die, and wherein each global IDDQ signature indicates how much electric current is drawn at each power supply pad during quiescent activity periods for the IC die;

storing the global IDDQ signature as a stored unique signature, wherein the stored unique signatures describe a plurality of spatially correlated across-die process variations that occurred during manufacturing of the IC die;

comparing a current IC unique signature with stored unique signatures of other IC dies, wherein the current IC unique signature is calculated as another n-tuple by using the ratio IDDQpad/IDDQglobal for every power supply pad in a current IC die being tested; and ranking, and sorting for binning, the current IC die by comparing the current IC unique signature for the current IC die to stored unique signatures for the other IC dies.

4. The system of claim 3, wherein quiescent activity periods are periods of time in which no logical operations are being performed by logic in the IC die.

5. A computer-readable storage medium encoded with a computer program, the computer program comprising computer executable instructions configured for:

recording electric current measurements at each power supply pad in an integrated circuit (IC) die that is being tested, wherein the electrical current measurements are of a quiescent current (IDDQ) drawn at each power supply pad, and wherein the IDDQ is current that is caused by leakage in the IC die;

combining recorded electrical current measurements for every power supply pad in the IC die to create a global IDDQ signature for the IC die, wherein the global IDDQ signature is created by forming an n-tuple of individual IDDQ ratios for each power supply pad in the IC die, and wherein each individual IDDQ ratio for each power supply pad is calculated from a ratio IDDQpad/IDDQglobal, wherein IDDQpad is a measured quiescent electric current at a particular power supply pad and IDDQglobal is a measured quiescent electric current for all of the IC die, and wherein each global IDDQ signature indicates how much electric current is drawn at each power supply pad during quiescent activity periods for the IC die;

storing the global IDDQ signature as a stored unique signature, wherein the stored unique signatures describe a plurality of spatially correlated across-die process variations that occurred during manufacturing of the IC die;

comparing a current IC unique signature with stored unique signatures of other IC dies, wherein the current IC unique signature is calculated as another n-tuple by using the ratio IDDQpad/IDDQglobal for every power supply pad in a current IC die being tested; and ranking, and sorting for binning, the current IC die by comparing the current IC unique signature for the current IC die to stored unique signatures for the other IC dies.

6. The computer-readable storage medium of claim 5, wherein quiescent activity periods are periods of time in which no logical operations are being performed by logic in the IC die.

* * * * *